United States Patent [19]
O et al.

[11] Patent Number: 5,663,083
[45] Date of Patent: Sep. 2, 1997

[54] PROCESS FOR MAKING IMPROVED MOS STRUCTURE WITH HOT CARRIER REDUCTION

[75] Inventors: Sungki O, Milpitas; Philippe Schoenborn, San Jose, both of Calif.

[73] Assignee: LSI Logic Corporation, Milpitas, Calif.

[21] Appl. No.: 695,569

[22] Filed: Aug. 12, 1996

Related U.S. Application Data

[62] Division of Ser. No. 374,195, Jan. 18, 1995, Pat. No. 5,598,021.

[51] Int. Cl.⁶ .................................................. H01L 21/265
[52] U.S. Cl. ........................... 438/303; 438/305; 438/719; 438/965
[58] Field of Search ........................ 437/44, 41, 977

[56] References Cited

U.S. PATENT DOCUMENTS

| | | | |
|---|---|---|---|
| 4,987,089 | 1/1991 | Roberts | 437/34 |
| 5,047,820 | 9/1991 | Garnett | 357/23.8 |
| 5,254,866 | 10/1993 | Ogoh | 257/369 |
| 5,319,231 | 6/1994 | Yamazaki et al. | 257/344 |
| 5,320,974 | 6/1994 | Hori et al. | 437/44 |
| 5,356,828 | 10/1994 | Swan et al. | 437/67 |
| 5,360,753 | 11/1994 | Park et al. | 437/67 |
| 5,372,957 | 12/1994 | Liang et al. | 437/35 |
| 5,491,099 | 2/1996 | Hsu | 437/44 |
| 5,538,909 | 7/1996 | Hsu | 437/44 |

FOREIGN PATENT DOCUMENTS

| | | | |
|---|---|---|---|
| 0 443 958 | 2/1991 | European Pat. Off. | 257/344 |
| 0 514 060 | 5/1992 | European Pat. Off. | 257/336 |
| 58-127380 | 7/1983 | Japan | 257/409 |
| 61-231768 | 10/1986 | Japan | 257/336 |
| 62-92372 | 4/1987 | Japan . | |
| 63-244683 | 7/1991 | Japan | 257/344 |
| 3-156976 | 7/1991 | Japan | 257/344 |

OTHER PUBLICATIONS

Sze, S.M., "Device Miniaturization", *Semiconductor Devices: Physics and Technology*, 1985, pp. 216–219 month unknown.

Chang, C.S., et al., "High–Voltage FET Integrated Circuit Process", *IBM Technical Disclosure Bulletin*, vol. 16, No. 5, Oct., 1973, pp. 1635–1636.

*Primary Examiner*—John Niebling
*Assistant Examiner*—Michael S. Lebentritt
*Attorney, Agent, or Firm*—John P. Taylor

[57] ABSTRACT

An MOS structure is disclosed which is provided with a trench in the substrate adjacent the channel region of the substrate, i.e., adjacent the area of the substrate over which the gate oxide and gate electrode are formed. The region of the substrate beneath the trench is lightly doped to provide a deeper LDD region in the substrate between the channel and the drain region so that electrons traveling through the channel to the drain region follow a path deeper in the substrate and farther spaced from the gate oxide in the region of the substrate between the source region and the drain region where high fields are encountered by electrons traveling through the channel from the source region to the drain region.

12 Claims, 8 Drawing Sheets

FORMING A SHALLOW TRENCH IN A
SEMICONDUCTOR SUBSTRATE ADJACENT A REGION
IN THE SUBSTRATE OVER WHICH
A GATE ELECTRODE IS FORMED

DOPING THE SEMICONDUCTOR SUBSTRATE,
INCLUDING THE PORTION BENEATH THE TRENCH,
TO FORM A LDD REGION IN THE SUBSTRATE
BENEATH THE TRENCH AND BETWEEN A DRAIN
REGION IN THE SUBSTRATE AND
A CHANNEL REGION IN THE SUBSTRATE
BENEATH THE GATE ELECTRODE

WHEREBY THE TRENCH AND LDD REGION
BENEATH THE TRENCH WILL CHANGE THE PATH OF
ELECTRONS TRAVELING TOWARD THE DRAIN
REGION THROUGH THE CHANNEL REGION OF THE
SUBSTRATE SO THAT DAMAGE TO THE GATE OXIDE
BENEATH THE GATE ELECTRODE WILL BE INHIBITED

PROCESS FOR MAKING IMPROVED MOS STRUCTURE WITH HOT CARRIER REDUCTION

CROSS-REFERENCE TO RELATED APPLICATIONS

This application is a division of application Ser. No. 08/374,195, filed Jan. 18, 1995 now U.S. Pat. No. 5,598,021.

BACKGROUND OF THE INVENTION

1. Field of the Invention

This invention relates to an improved MOS structure having reduced hot carrier characteristics. More particularly, this invention relates to an improved MOS structure having a trench in the substrate adjacent the gate electrode to permit deeper source/drain doping of the substrate adjacent the gate electrode to inhibit electron penetration of the gate oxide, and a process for forming such a structure.

2. Description of the Related Art

In conventional CMOS structures, the N channel transistors are known to experience gate oxide damage during operation due to hot carriers. Hot carriers are electrons traveling through the channel beneath the gate oxide from the source to the drain which, when encountering high fields adjacent the drain region, tend to migrate toward and into the gate oxide region above the channel, instead of toward the drain region, as a result of the high energy imparted to the electron by the high fields. Such electrons, known as hot carriers, damage the gate oxide resulting in a degradation in performance of the transistor and the MOS structure.

Efforts in the past to remedy this problem have included the placement of lightly doped drain (LDD) regions between the drain region and the channel, i.e., in the portion of the substrate beneath the oxide spacer on the sidewall of the gate electrode. Attempts to solve the problem have also included driving the source/drain lateral junction with the channel region deeper, i.e., diffusing the source/drain dopants deeper into the substrate. However, the disadvantages of these old methods are lack of localized control of the dopant distribution of LDD and loss of source/drain profile around the gate.

It would, therefore, be desirable to provide an MOS structure wherein electrons traveling through the channel beneath the gate oxide from the source to the drain of an MOS device do not enter and damage the gate oxide of the MOS device when encountering high electric fields adjacent the drain region, while avoiding the problems encountered by the prior art when attempting to solve the hot carrier problem.

SUMMARY OF THE INVENTION

In accordance with the invention an MOS structure is provided with a trench in the substrate adjacent the channel region of the substrate, i.e., adjacent the area of the substrate over which the gate oxide and gate electrode are formed; and the region of the substrate beneath the trench is doped to provide a deeper doped region between the channel and the drain region so that electrons traveling through the channel to the drain region are following a path deeper in the substrate and farther spaced from the gate oxide when such high fields are encountered.

DETAILED DESCRIPTION OF THE INVENTION

The invention comprises an improved MOS structure provided with a trench in the substrate adjacent the channel region of the substrate, i.e., adjacent the area of the substrate over which the gate oxide and gate electrode are formed. The region of the substrate beneath the trench is doped to provide a deeper (LDD) doped region between the channel and the drain region so that electrons traveling through the channel to the drain region travel along a path deeper in the substrate and farther spaced from the gate oxide in the region adjacent the drain region where high electric fields are normally encountered by the electrons. Electrons acquiring high energy while passing through such high energy fields are thereby inhibited from reaching and damaging the gate oxide. By use of the term "high electric fields" is meant electric fields having a voltage of 1 volt/micrometer (μm) or higher. The term "high electric field" may also be defined as an electric field which imparts enough energy to carriers traveling between the source/drain regions of an MOS device so as to inject the carriers into the gate oxide.

Figure 1:
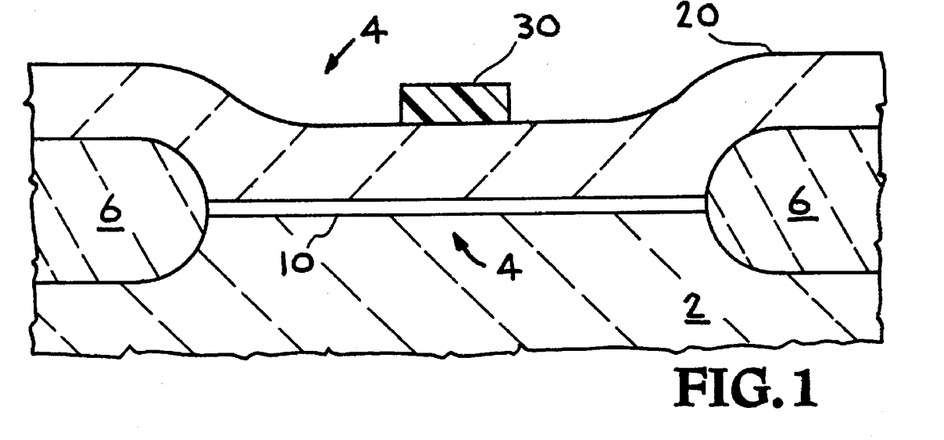
FIG. 1 is a vertical fragmentary cross-sectional view of a silicon substrate prior to the patterning of a polysilicon layer formed over an oxide layer on the surface of the substrate.

Turning now to FIG. 1, a silicon substrate 2 is shown having an active region generally designated at 4 where an MOS device is to be formed which has been previously defined by masking of substrate 2 and the formation of field oxide 6 surrounding active region 4. A thin layer 10 of silicon oxide, e.g., about 60–100 Angstroms (Å), which will serve as the gate oxide of the MOS device, is shown already formed over active region 4 and a doped polysilicon layer 20, from which the gate electrode of the MOS device will be formed, is shown as blanket deposited over the entire structure. A photoresist mask 30, defining the portion of polysilicon layer 20 which will become the gate electrode, is shown formed over polysilicon layer 20.

Figure 2:
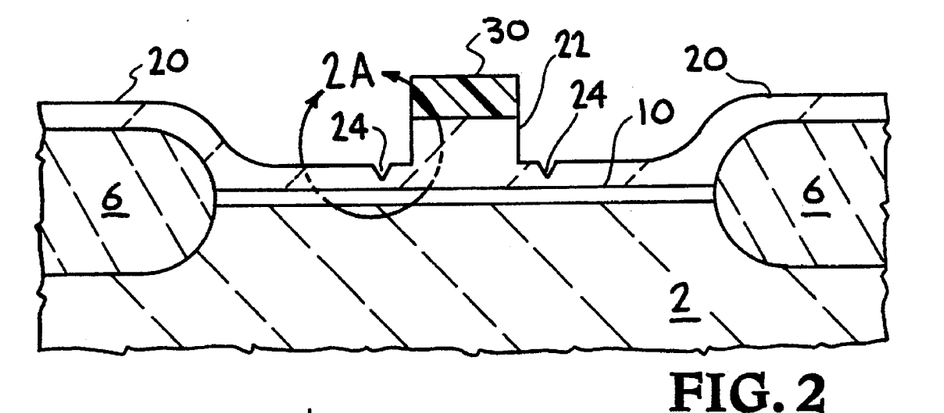
FIG. 2 is a vertical fragmentary cross-sectional view of a silicon substrate after partial patterning of the polysilicon layer to form a gate electrode on the surface of the substrate.
Figure 2A:
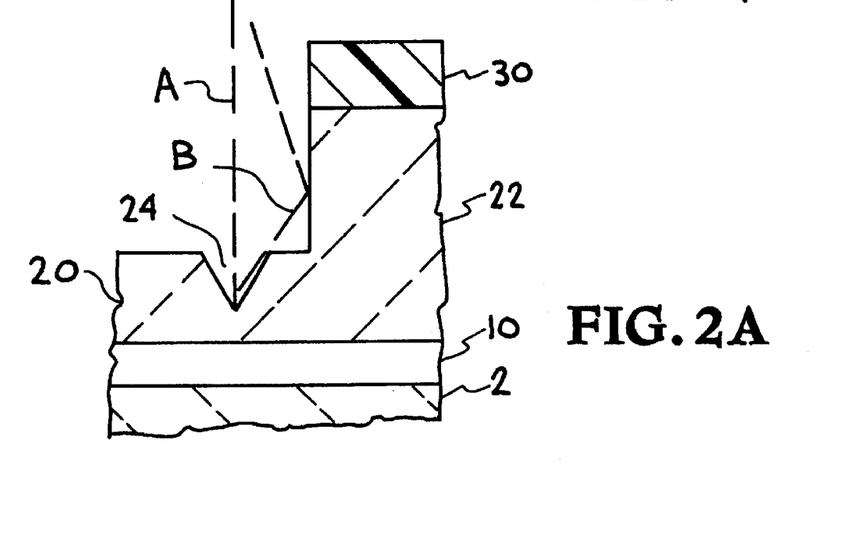
FIG. 2A is a magnified view of the portion of FIG. 2 where one of the trenches will be formed, showing the additional etching of the polysilicon layer in this region.
Figure 3:
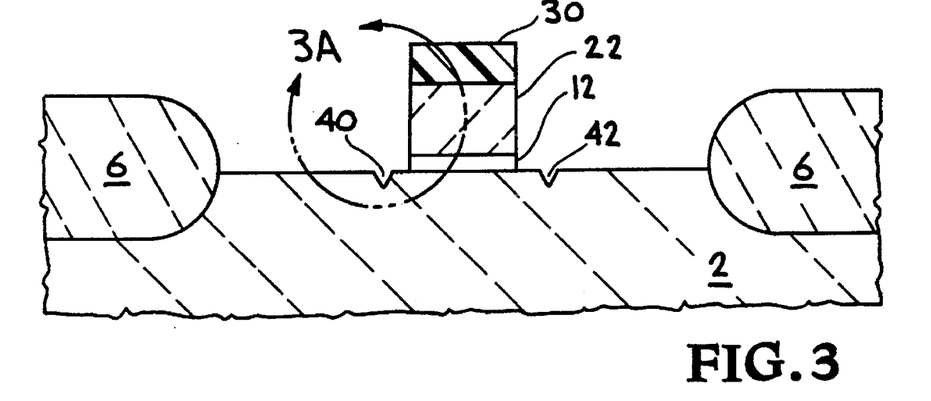
FIG. 3 is a fragmentary cross-sectional view of the structure of FIG. 2 after completion of the etching of the polysilicon layer and the oxide layer thereunder showing the further etching of the substrate to form trenches in the substrate adjacent the gate electrode.
Figure 3A:
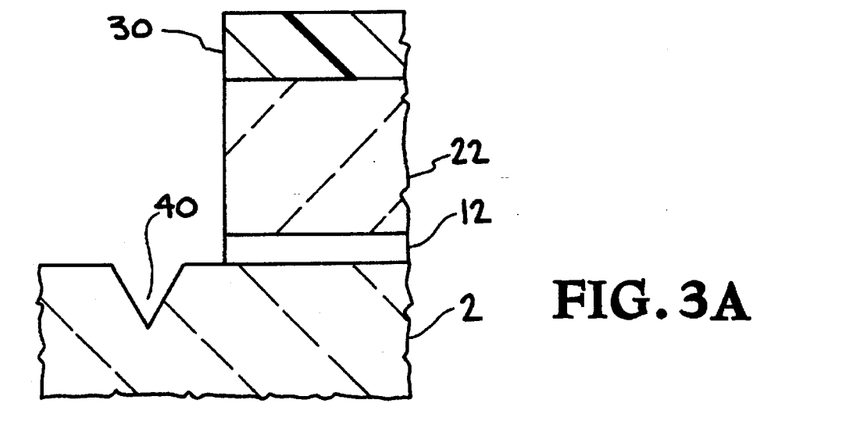
FIG. 3A is a magnified view of the portion of FIG. 3 where one of the trenches has been formed in the substrate.
Figure 4:
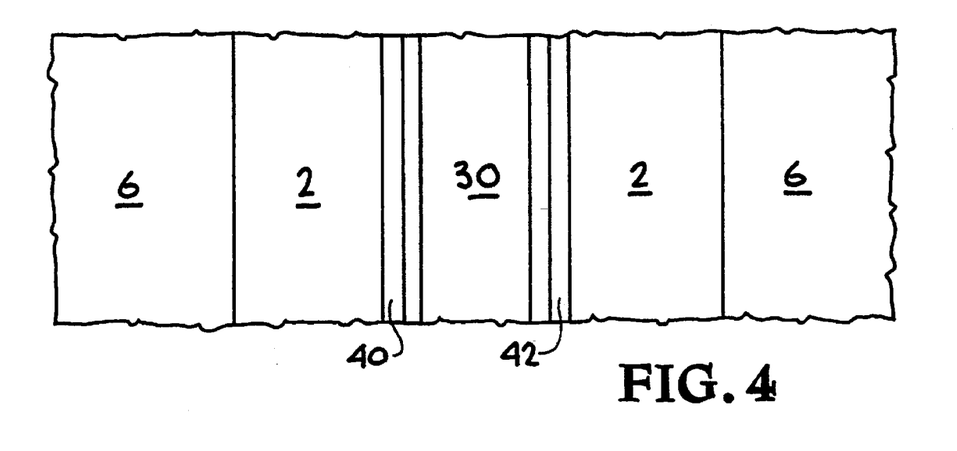
FIG. 4 is a fragmentary top view of the structure of FIG. 3 showing the location of the trenches in the substrate on opposite sides of the gate electrode.

The unmasked portions of polysilicon layer 20, and oxide layer 10 beneath polysilicon layer 20, may then be selectively etched, using conventional etch processing such as reactive ion etching, to define gate electrode 22 and gate oxide 12 beneath gate electrode 22. However, as shown in FIGS. 2 and 2A, in accordance with a preferred embodiment, the formation of the trench of the invention is carried out using conditions which favor preferential etching of the region adjacent the polysilicon electrode 22 being formed from layer 20. Thus, as shown in FIG. 2, the reactive ion etch conditions during the patterning of layer 20 may be varied to etch the region in layer 20, denoted at 24 in FIG. 2, at a faster rate than the remainder of polysilicon layer 20, resulting in the trench-like profile in layer 20 at 24 shown in FIGS. 2 and 2A. This preferential etching will then continue, as the etching continues down to silicon substrate 2, resulting in the formation of shallow trenches 40 and 42 in substrate 2, as shown in FIGS. 3, 3A, and 4, respectively formed along the opposite sides of gate electrode 22.

While shallow trenches 40 and 42 may be formed in substrate 2 in accordance with the invention utilizing any one of a number of techniques, in a preferred embodiment shallow trenches 40 and 42 are formed by varying the normal reactive ion etch conditions used to pattern polysilicon layer 20 to form electrode 22. The normal reactive ion etching conditions may be changed by increasing the negative bias power on the wafer support electrode beneath the wafer. While the amount of increase of the substrate support bias power will vary with the process parameters and particular etching apparatus utilized, when this method is used to form the trenches of the invention, the increase in substrate support bias power should be at least about 25%, and typically will be increased at least about 50% over the power conventionally utilized. If desired, the plasma power may also be increased by the same percentages, although the main effect will be noted from the increase in substrate bias power.

For example, in a conventional polysilicon plasma etch process using chlorine gas and a pressure of a few milliTorr, where the normal RF plasma power level utilized to pattern a polysilicon layer on a 6 inch diameter wafer might be about 300 watts, the power level may be increased, in accordance with the invention, to about 600 watts; and the wafer bias power may be increased, in accordance with the invention, from about 5 watts up to about 8 watts or higher, to obtain the preferential etching of the region adjacent the masked portion of polysilicon layer 20 to eventually form shallow trenches 40 and 42 in substrate 2.

Thus, as best seen in FIG. 2A, using the above described etch conditions, region 24 of polysilicon layer 20 is etched at a faster rate than the remainder of polysilicon layer 20, resulting in a trench-like profile in layer 20. Then as the etching continues, the underlying silicon substrate 2 is reached first beneath region 24 and the trench-like structure formed in polysilicon layer 20 is replicated in silicon substrate 2 as trenches 40 and 42, as shown in FIGS. 3, 3A, and 4.

We do not wish to be bound by any particular theories as to why or how the portion of polysilicon layer 20 and substrate 2 adjacent polysilicon gate electrode 22 etches faster than the remainder of the exposed silicon when the plasma power and wafer support bias power are increased. However, it is believed that the additional bias power on the wafer support imparts sufficient additional energy to the ions which normally are reflected off the sidewall of polysilicon gate electrode 22 as it forms, to cause these reflected ions to impact the surface of polysilicon layer 20, and eventually substrate 2, at an energy level sufficient to cause additional etching (erosion) by these reflected ions, which is additive to the conventional etching by the ions perpendicularly bombarding the silicon surfaces, i.e., bombarding polysilicon layer 20 and then silicon substrate 2 where trenches 40 and 42 are formed therein. This is shown in FIGS. 2A and 3A where dotted line path A shows the perpendicular path of the unreflected ions in the plasma, and dotted line path B shows the path of the reflected ions. By also increasing the plasma power, as well as the bias power, the flux density of the ions in the plasma is also increased, resulting in an increase of the number of ions which are reflected off the sidewall of gate electrode 22 as it forms during the etching step.

Trenches 40 and 42 are each preferably formed to a depth ranging from about 400 to about 600 Angstroms (Å), and typically to a depth of about 500 Å. Trenches 40 and 42 are each formed to a width which also ranges from about 400 to about 600 Angstroms (Å), and typically to a width of about 500 Å. It will be noted that trenches 40 and 42 are formed by this method at a point in substrate 2 which is spaced slightly, e.g., from at least about 100 Å to 500 Å, from gate electrode 22 and the underlying gate oxide. This inhibits the possibility of damage to the gate oxide by such trench formation, i.e., inhibits undercutting of the polysilicon gate electrode by attack of the gate oxide during the etch step.

Figure 5:
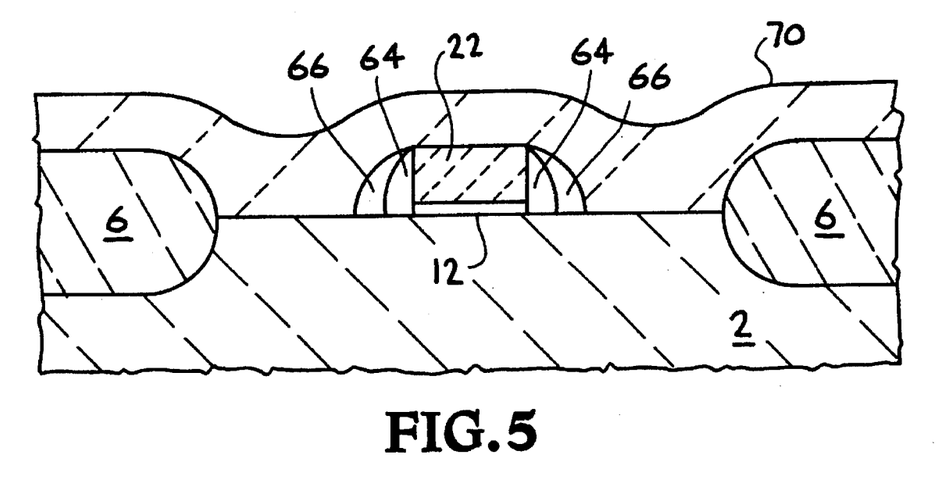
FIG. 5 is a fragmentary view of the structure of FIG. 1 after conventional patterning of the polysilicon layer to form a gate electrode, illustrating preliminary steps in an alternate method of forming the trenches of the invention in the silicon substrate adjacent the gate electrode.
Figure 6:
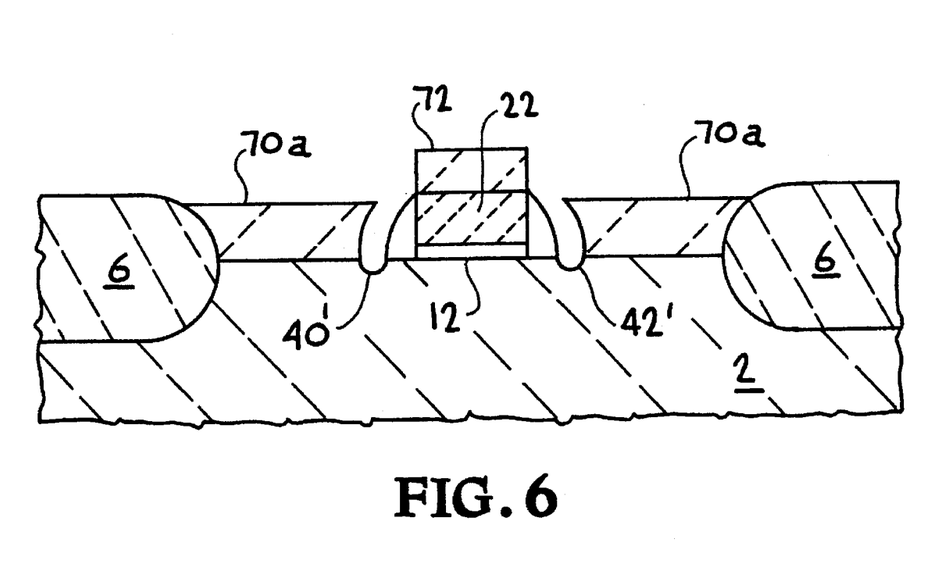
FIG. 6 is a fragmentary view of the structure of FIG. 5 showing further steps in the illustrated alternate method of forming the trenches of the invention in the silicon substrate adjacent the gate electrode.

Referring to FIGS. 5 and 6, an alternate method of forming trenches 40' and 42' is shown wherein gate electrode 22 is first conventionally formed by an anisotropic etch, oxide spacers 64 are then formed on the sidewalls of gate electrode 22, and nitride spacers 66 are then formed adjacent oxide spacers 64. A further layer 70 of oxide is then formed over the structure and planarized to expose the surface of nitride spacers 66 adjacent remaining portions 70a of layer 70. The exposed surface of polysilicon gate electrode 22 is then oxidized at 72 and nitride spacers 66 are etched away using a silicon nitride etch selective to silicon oxide, i.e., an etchant which will remove silicon nitride without also etching silicon oxide at the same rate. Removal of nitride spacers 66 exposes substrate 2 in the region where it is desired to form trenches 40' and 42', i.e., at a point spaced from about 10 Å to about 1000 Å from gate electrode 22. Substrate 2 is then etched, using the oxide portions (oxide portions 70a, oxide spacers 64, and oxide 72 on gate electrode 22) as a mask, to form trenches 40' and 42'. Oxide portions 70a, oxide spacers 64, and oxidized upper surface 72 of gate electrode 22 are then all removed leaving a structure similar to that previously described. The resulting structure may then be further processed in the same manner as the previously formed structure formed, will now be described below.

Figure 7:
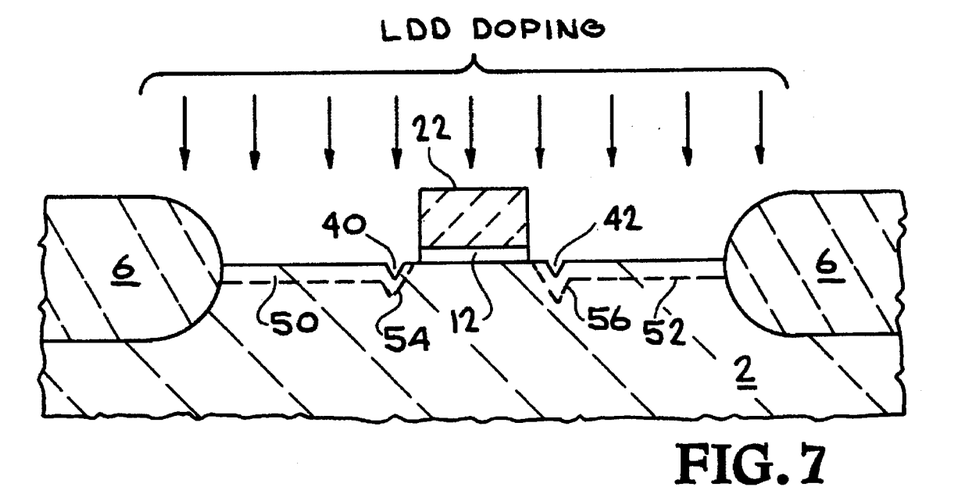
FIG. 7 is a vertical fragmentary cross-sectional view of the structure of FIG. 3 showing the subsequent doping of the substrate, including the region beneath the trench, to form LDD regions in the substrate beneath the trench.

Regardless of the method used in forming trenches 40 and 42 (or trenches 40' and 42'), the exposed portions of substrate 2 are then lightly doped to form LDD regions 50 and 52 beneath, but adjacent to, the surface of substrate 2, including the region of substrate 2 beneath trench 40, as shown at 54 in FIG. 7 and the region of substrate 2 beneath trench 42, as shown at 56 in FIG. 7. Such LDD doping is conventional and is usually carried out, for example, using boron to form P− regions having a doping density of $10^{16}$ atoms/cm$^3$, for PMOS devices, or using phosphorus or arsenic to form N− regions having a doping density of about $10^{16}$ atoms/cm$^3$ for NMOS devices.

For purposes of this invention, the LDD doping should range in concentration from about $1 \times 10^{18}$ to about $1 \times 10^{19}$ atoms/cm$^3$ (regardless of the type of dopant) to ensure sufficient concentration of dopant in the respective regions of the substrate beneath the trenches to provide the desired carrier path through the channel region to the source/drain regions.

Figure 8:
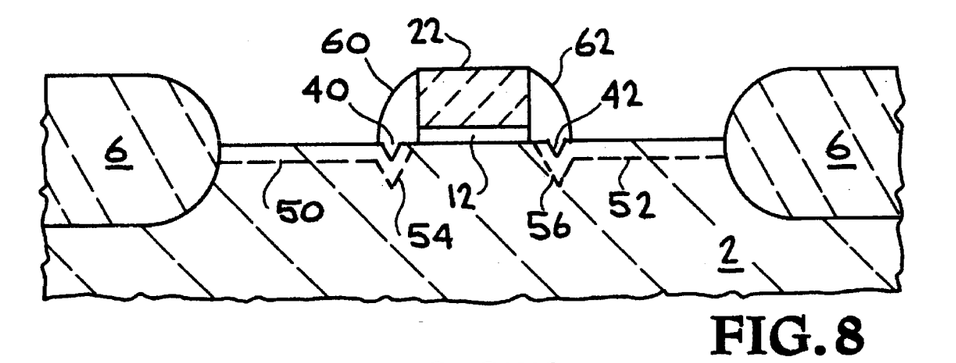
FIG. 8 is a vertical fragmentary cross-sectional view of the structure of FIG. 7 showing the formation of oxide sidewall spacers on the sidewalls of the gate electrode and extending into the trench over the implanted region of the substrate beneath the trench.
Figure 9:
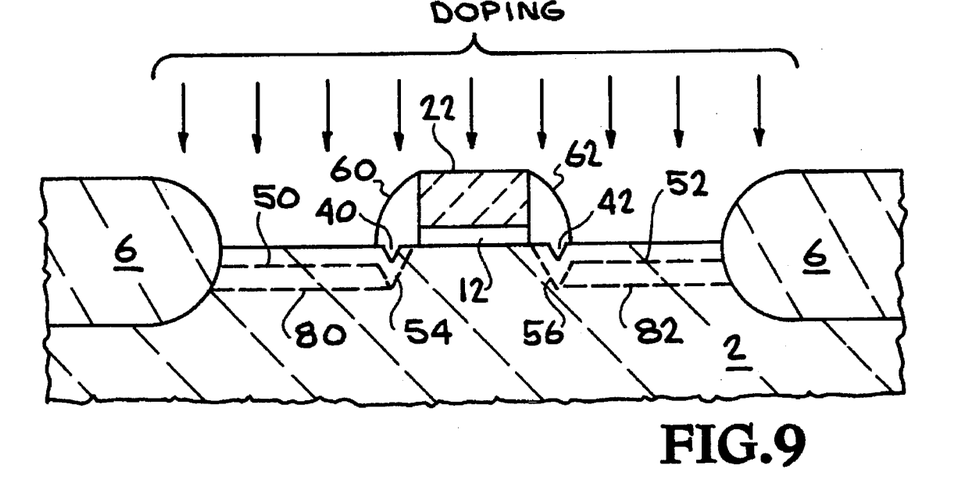
FIG. 9 shows the structure of FIG. 8 after implantation to form the source/drain regions in the substrate adjacent the oxide sidewall spacers.
Figure 10:
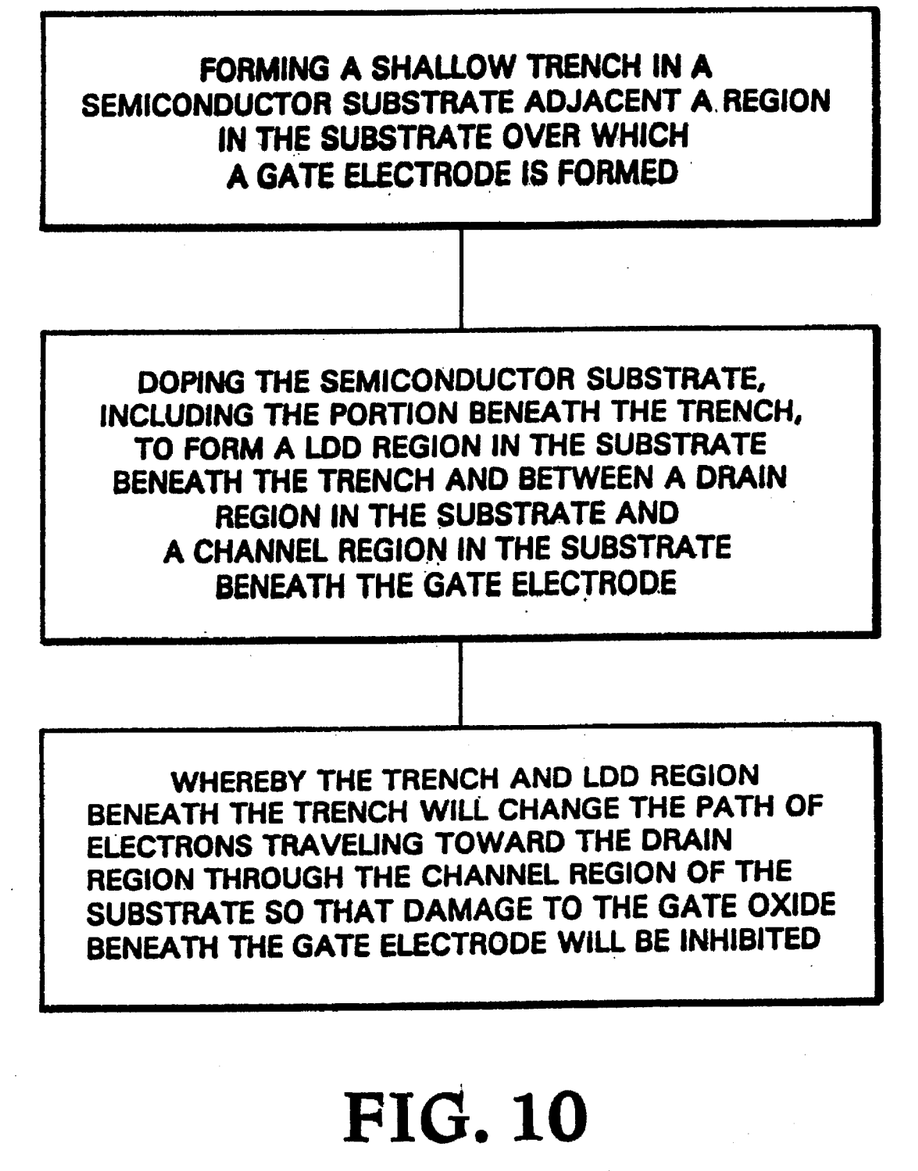
FIG. 10 is a flowsheet illustrating the process of the invention.

After the LDD doping, an oxide layer is then formed over the structure and anisotropically etched to form oxide sidewall spacers 60 and 62 on the respective sidewalls of gate electrode 22, as shown in FIG. 8. While the formation of oxide sidewall spacers on the sidewall of the gate electrode (to insulate the gate electrode from subsequently formed source/drain electrodes) is conventional, in accordance with the invention, as also shown in FIG. 8, oxide sidewall spacers 60 and 62 also respectively extend into, and fill up, trenches 40 and 42 so that LDD region 54, formed beneath trench 40, is also beneath oxide sidewall spacer 60, and LDD region 56, formed beneath trench 42, is also beneath oxide sidewall spacer 62.

Following the formation of oxide sidewall spacers 60 and 62, the structure is conventionally doped to form source/drain regions 80 and 82 in substrate 2, as shown in FIG. 6. The MOS device is then conventionally completed by the formation of source and drain contacts, etc. Doping of substrate 2 to form N+ or P+ source/drain regions 80 and 82 results in merging of the previous LDD doping of regions 50 and 52 respectively into the more concentrated doping regions 70 and 72, except for LDD regions 54 and 56 formed respectively beneath trenches 40 and 42 and oxide sidewall spacers 60 and 62, which LDD regions are respectively masked by spacers 60 and 62 during the source/drain doping, e.g., during the implantation of source/drain regions 80 and 82.

It should be noted that while the problem of hot carrier generation and resulting gate oxide degradation which this invention addresses only occurs adjacent the junction of the channel with the drain region, trenches are formed adjacent both sides of gate electrode 22, resulting in the formation of deeper LDD regions beneath both trenches because at the time of construction of the lower levels of an integrated circuit structure embodying this invention, it may not be known which of the source/drain regions 80 and 82 will eventually be utilized as the drain region of the MOS transistor.

Figure 11A:
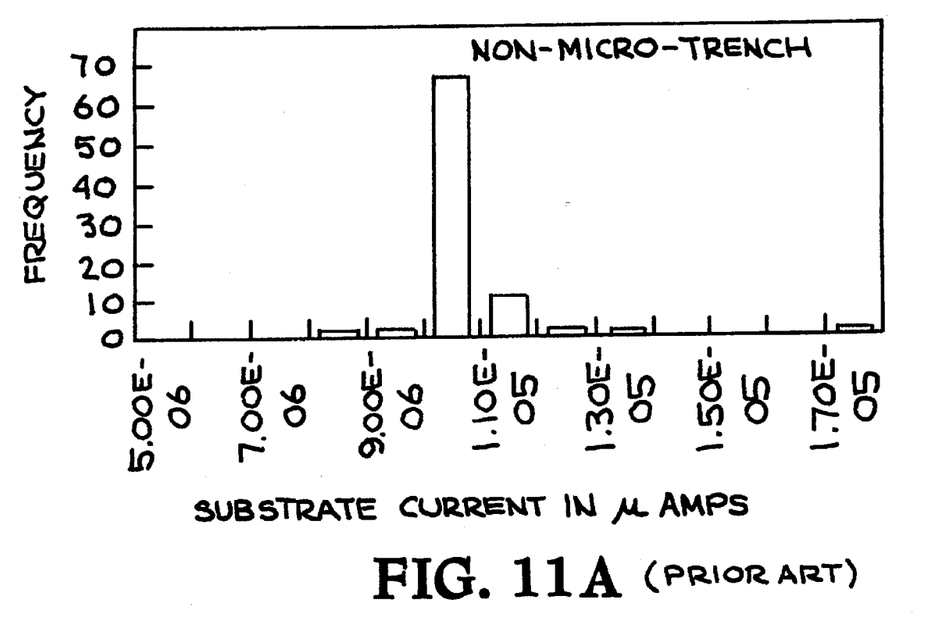
FIGS. 11(A)–11(B) are a graph plotting the frequency of the occurrence of high substrate current in prior art MOS structures versus MOS structures provided with the trench of the invention.
Figure 11B:
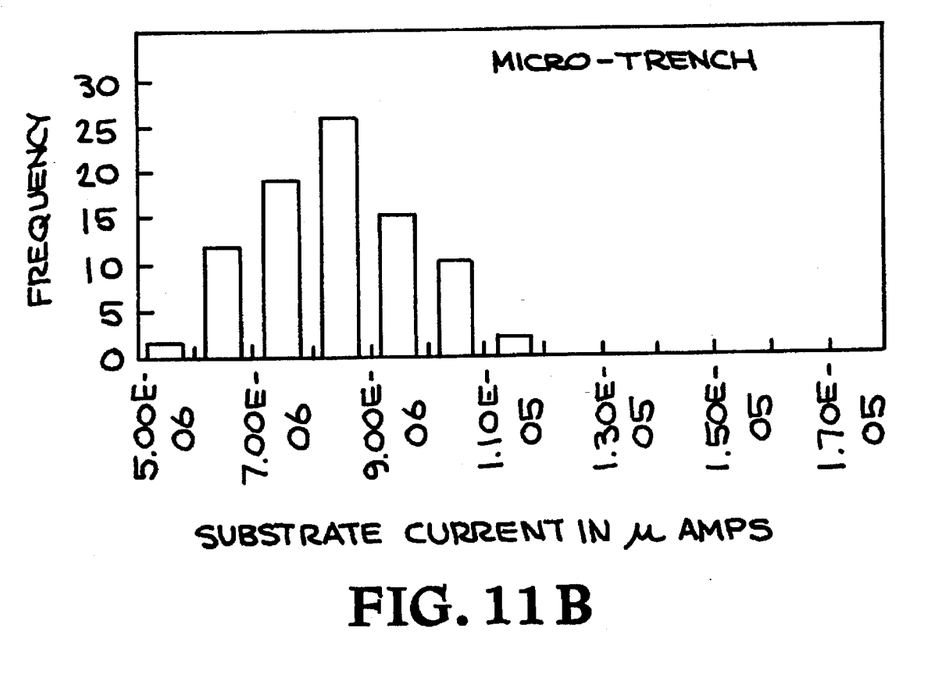

To further illustrate the invention, a number of MOS devices of varying channel widths were constructed on silicon substrate having trenches ~500 Å deep and ~500 Å in width formed on each side of the polysilicon gate electrode. As a control a number of MOS devices were also constructed without the trench of the invention, i.e., in accordance with the prior art. The respective substrate currents, indicative of the number of electron "hot carriers" entering the gate oxide, were measured for 100 of each type of the structures. As shown in the graphs of FIG. 11, most of the MOS structures formed in accordance with the invention had substrate currents well below 10–11 microamps, while almost all of the prior art MOS structures had leakage currents of 10 microamps or higher.

Figure 12:
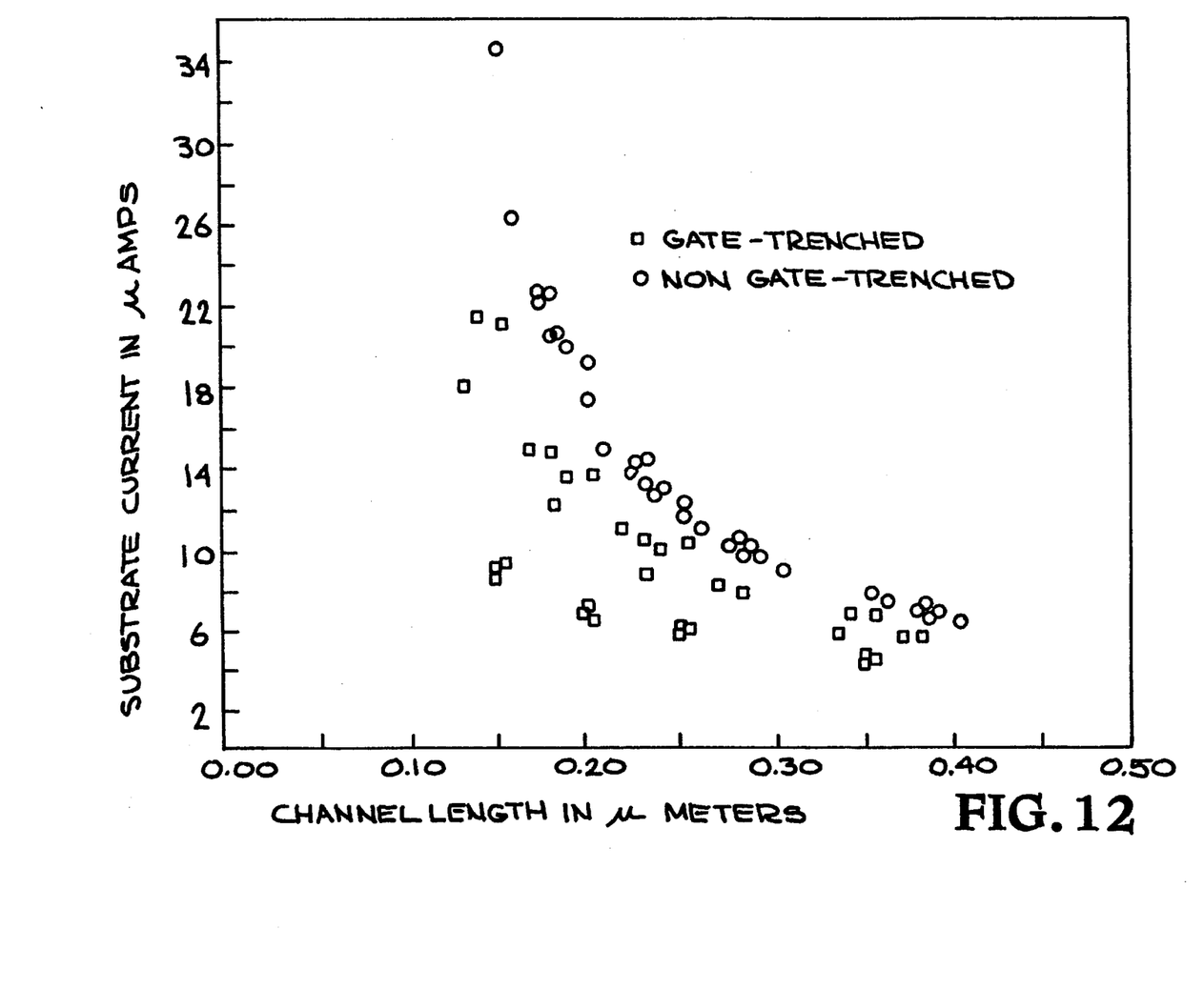
FIG. 12 is a graph plotting substrate current measurements for various channel lengths of prior art MOS structures and MOS structures of the invention.

The substrate currents of the respective devices were also plotted against channel length, with the squares indicating substrate current measurements of MOS structures formed with shallow trenches in the substrate adjacent the sides of the gate electrodes, and the circles representing prior art MOS structures without the trenches of the invention. It will be noted in the graph of FIG. 12 that consistently at each channel length, the MOS structures formed in accordance with the invention had lower substrate currents.

Figure 13A:
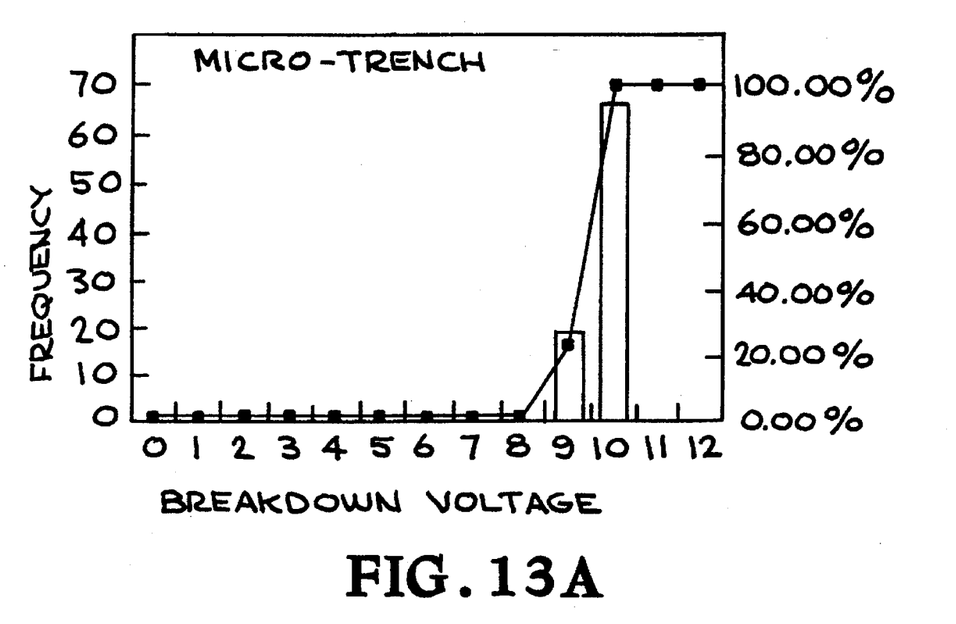
FIGS. 13(A)–13(B) are a graph plotting breakdown voltages of the gate oxide respectively of prior art MOS structures and the MOS structures of the invention.
Figure 13B:
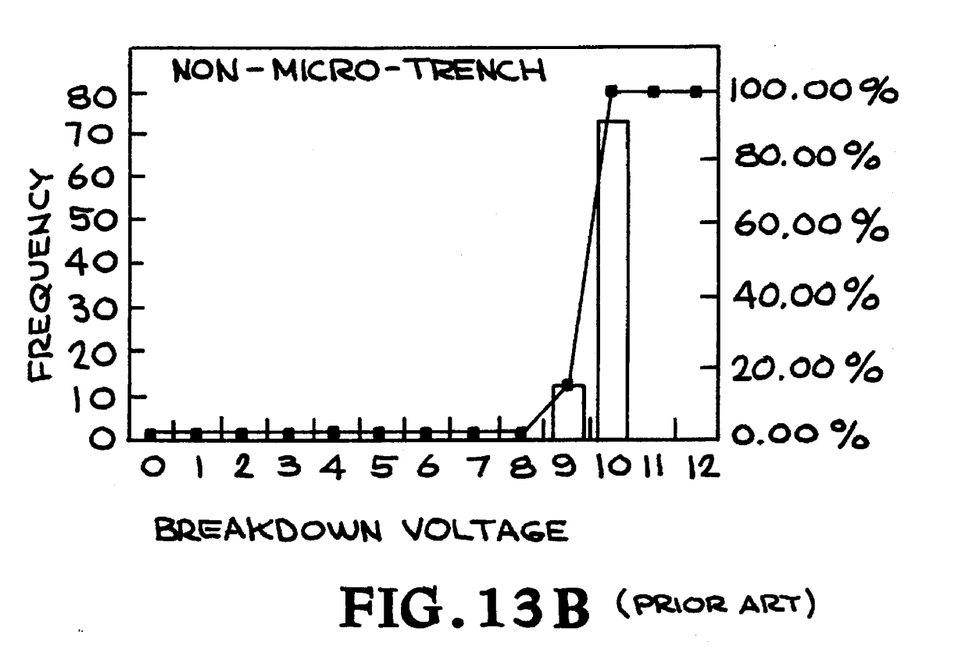

Both the prior art MOS devices and the devices constructed with shallow trenches in the substrate adjacent the gate electrode, in accordance with the invention, were tested for gate oxide voltage breakdown. The graphs of FIG. 13 show that in both types of construction, there is virtually no gate oxide break down at voltages lower than 9 volts, indicating that the formation of the trench in the MOS structures of the invention had no adverse impact on the breakdown voltage of the gate oxide.

Thus, the invention provides an improved MOS structure, and method of making same, having enhanced protection against hot carrier penetration of the gate oxide by electrons energized as they pass through high fields in the channel region adjacent the drain region of the device.

Having thus described the invention what is claimed is:

1. A process for forming an MOS structure in a semiconductor substrate having protection against bombardment of gate oxide by electrons energized by high electric fields in the substrate comprising:
   a) forming a first trench in said substrate in between and laterally adjacent to:
      i) a drain region in said substrate; and
      ii) a channel region of said substrate over which said gate oxide and a gate electrode are formed;
   b) spacing said first trench from said gate oxide and said gate electrode a distance sufficient to inhibit damage to said gate oxide and said gate electrode during said step of forming said first trench;
   c) forming a lightly doped (LDD) region in said substrate beneath said first trench between said channel region and said drain region and laterally contiguous with both said drain region and said channel region; and
   d) forming an oxide spacer over and in said first trench to fill said first trench, and on a sidewall of said gate electrode, to permit subsequent formation of said drain region in said substrate adjacent said LDD region formed beneath said first trench and said oxide spacer; whereby electrons traveling through said channel region to said drain region will follow a path deeper in said substrate and farther spaced from said gate oxide in the portion of said channel region of said substrate adjacent said first trench where high electric fields are encountered.

2. The process of claim 1 which includes the further step of forming a second trench in said substrate on an opposite side of said gate electrode and gate oxide from said first trench; whereby said first and second trenches are respectively formed in said substrate adjacent portions of said substrate where a source region and said drain region will be subsequently formed.

3. A process for forming an MOS structure in a semiconductor substrate having protection against bombardment of gate oxide by electrons energized by high electric fields in the substrate comprising:

a) forming a trench in said substrate in between and laterally adjacent to:
  i) a drain region in said substrate; and
  ii) a channel region of said substrate over which said gate oxide and a gate electrode are formed;
b) spacing said trench in said substrate at a point at least about 10 Å from said gate oxide and said gate electrode formed on said substrate;
c) forming a lightly doped (LDD) region in said substrate beneath said trench between said channel region and said drain region and laterally contiguous with both said drain region and said channel region; and
d) forming an oxide spacer over and in said trench to fill said trench, and on a sidewall of said gate electrode, to permit subsequent formation of said drain region in said substrate adjacent said LDD region formed beneath said trench and said oxide spacer;

whereby electrons traveling through said channel region to said drain region will follow a path deeper in said substrate and farther spaced from said gate oxide in the portion of said channel region of said substrate adjacent said trench where high electric fields are encountered.

4. A process for forming an MOS structure in a semiconductor substrate having protection against bombardment of gate oxide by electrons energized by high electric fields in said substrate comprising:

a) forming first and second trenches in said substrate respectively positioned laterally adjacent opposite ends of a channel region of said substrate over which said gate oxide and a gate electrode are formed, said first trench positioned laterally adjacent a drain region in said substrate and said second trench positioned laterally adjacent a source region in said substrate;
b) spacing each of said first and second trenches from said gate oxide and said gate electrode a distance sufficient to inhibit damage to said gate oxide and said gate electrode during said step of forming said first and second trenches;
c) forming first and second lightly doped (LDD) regions in said substrate respectively beneath said first and second trenches between said channel region and said source/drain regions by doping said substrate respectively through the walls of said first and second trenches, said first LDD region formed laterally contiguous with both said channel region and said drain region and said second LDD region formed laterally contiguous with both said channel region and said source region; and
d) forming oxide spacers respectively over and in said first and second trenches to fill said trenches, and on sidewalls of said gate electrode, to permit subsequent respective formation of said source and drain regions in said substrate adjacent said LDD regions formed beneath said first and second trenches and said oxide spacers;

whereby electrons traveling through said channel region to said drain region will follow a path deeper in the substrate and farther spaced from said gate oxide in the portion of said channel region of said substrate adjacent said first trench where high electric fields are encountered.

5. The process of claim 4 wherein said trenches each have a width of from about 400 Å to about 600 Å and a depth of from about 400 Å to about 600 Å.

6. The process of claim 4 wherein said region of said substrate beneath each of said trenches is doped to a dopant concentration of from about $1 \times 10^{18}$ to about $1 \times 10^{19}$ atoms/cm$^3$.

7. The process of claim 1 wherein said first trench is formed in said substrate by sufficiently increasing the bias power on a substrate support holding said substrate during a plasma etch process to pattern a polysilicon layer to define said gate electrode over said substrate from the bias power normally applied to the substrate to provide a uniform etch of the polysilicon layer.

8. The process of claim 7 wherein said bias power is increased a minimum of at least about 25% during said plasma etching of said polysilicon layer to form said first trench during said patterning of said polysilicon layer to form said gate electrode.

9. The process of claim 1 wherein said first trench is formed by selectively masking other regions of said substrate thereby exposing only the region of said substrate where it is desired to form said first trench; and said exposed region of said substrate is then etched to form said first trench.

10. The process of claim 1 wherein said first trench is formed to a width of from about 400 Å to about 600 Å.

11. The process of claim 1 wherein said first trench is formed to a depth of from about 400 Å to about 600 Å.

12. The process of claim 1 wherein said step of doping said region of said substrate beneath said first trench to form said LDD region in said substrate further comprises doping said substrate to a dopant concentration of from about $1 \times 10^{18}$ to about $1 \times 10^{19}$ atoms/cm$^3$.

* * * * *